US006466025B1

(12) United States Patent
Klang

(10) Patent No.: US 6,466,025 B1
(45) Date of Patent: Oct. 15, 2002

(54) ALTERNATOR TESTER

(75) Inventor: James K. Klang, Eagan, MN (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/483,623

(22) Filed: Jan. 13, 2000

(51) Int. Cl.$^7$ .............................................. G01N 27/416
(52) U.S. Cl. ....................................... 324/429; 324/426
(58) Field of Search ................................. 324/426, 772, 324/429; 320/104, 134; 322/28

(56) References Cited

U.S. PATENT DOCUMENTS

| | | | |
|---|---|---|---|
| 2,514,745 A | 7/1950 | Dalzell ........................ 171/95 |
| 3,356,936 A | 12/1967 | Smith ........................ 324/29.5 |
| 3,562,634 A | 2/1971 | Latner ............................. 31/4 |
| 3,593,099 A | 7/1971 | Scholl ........................... 320/13 |
| 3,607,673 A | 9/1971 | Seyl ............................... 204/1 |
| 3,676,770 A | 7/1972 | Sharaf et al. ............... 324/29.5 |
| 3,729,989 A | 5/1973 | Little .......................... 73/133 |
| 3,753,094 A | 8/1973 | Furuishi et al. ............. 324/29.5 |
| 3,808,522 A | 4/1974 | Sharaf ....................... 324/29.5 |
| 3,811,089 A | 5/1974 | Strezelewicz ............... 324/170 |
| 3,873,911 A | 3/1975 | Champlin .................. 324/29.5 |
| 3,876,931 A | 4/1975 | Godshalk ................... 324/29.5 |
| 3,886,443 A | 5/1975 | Miyakawa et al. ......... 324/29.5 |
| 3,889,248 A | 6/1975 | Ritter ......................... 340/249 |
| 3,906,329 A | 9/1975 | Bader .......................... 320/44 |
| 3,909,708 A | 9/1975 | Champlin .................. 324/29.5 |
| 3,936,744 A | 2/1976 | Perlmutter ................... 324/158 |
| 3,946,299 A | 3/1976 | Christianson et al. ......... 320/43 |
| 3,947,757 A | 3/1976 | Grube et al. ................. 324/28 |
| 3,969,667 A | 7/1976 | McWilliams ............... 324/29.5 |
| 3,979,664 A | 9/1976 | Harris .......................... 324/17 |
| 3,984,762 A | 10/1976 | Dowgiallo, Jr. ............. 324/29.5 |
| 3,984,768 A | 10/1976 | Staples ........................ 324/62 |
| 3,989,544 A | 11/1976 | Santo .......................... 429/65 |
| 4,008,619 A | 2/1977 | Alcaide et al. ............... 73/398 |
| 4,053,824 A | 10/1977 | Dupuis et al. .............. 324/29.5 |
| 4,070,624 A | 1/1978 | Taylor ......................... 327/158 |
| 4,086,531 A | 4/1978 | Bernier ........................ 324/158 |
| 4,112,351 A | 9/1978 | Back et al. .................... 324/16 |
| 4,114,083 A | 9/1978 | Benham et al. ................ 320/39 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |

(List continued on next page.)

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

(List continued on next page.)

*Primary Examiner*—N. Le
*Assistant Examiner*—Wasseem H. Hamdan
(74) *Attorney, Agent, or Firm*—Westman, Champlin & Kelly

(57) ABSTRACT

The present invention provides a straightforward diagnostic system and testing procedure that gives relevant data on the performance of the charging system in a battery-based electrical system. The overall method for testing the alternator comprising determining a threshold voltage of the battery-based electrical system, powering the alternator, determining a charging current generated by the alternator, and determining a charging voltage generated by the alternator. In this manner, an apparatus and system capable of rapidly determining whether a vehicle charging system is operating properly are disclosed.

31 Claims, 5 Drawing Sheets

U.S. PATENT DOCUMENTS

| | | | |
|---|---|---|---|
| 4,178,546 A | 12/1979 | Hulls et al. ................. | 324/158 |
| 4,193,025 A | 3/1980 | Frailing et al. ............. | 324/427 |
| 4,207,611 A | 6/1980 | Gordon ....................... | 364/580 |
| 4,849,700 A | 7/1989 | Morioka et al. ............ | 324/427 |
| 4,876,495 A | 10/1989 | Palanisamy et al. .......... | 320/18 |
| 4,881,038 A | 11/1989 | Champlin .................. | 324/426 |
| 4,912,416 A | 3/1990 | Champlin .................. | 324/509 |
| 4,913,116 A | 4/1990 | Katogi et al. ............... | 123/425 |
| 4,929,931 A | 5/1990 | McCuen ..................... | 340/636 |
| 4,931,738 A | 6/1990 | MacIntyre et al. .......... | 324/435 |
| 4,937,528 A | 6/1990 | Palanisamy ................ | 324/430 |
| 4,947,124 A | 8/1990 | Hauser ....................... | 324/430 |
| 4,956,597 A | 9/1990 | Heavey et al. ................ | 320/14 |
| 4,968,941 A | 11/1990 | Rogers ....................... | 324/428 |
| 4,968,942 A | 11/1990 | Palanisamy ................ | 324/430 |
| 5,004,979 A | 4/1991 | Marino et al. .............. | 324/160 |
| 5,032,825 A | 7/1991 | Xuznicki .................... | 340/636 |
| 5,037,778 A | 8/1991 | Stark et al. ................. | 437/216 |
| 5,047,722 A | 9/1991 | Wurst et al. ................ | 324/430 |
| 5,087,881 A | 2/1992 | Peacock ..................... | 324/378 |
| 5,095,223 A | 3/1992 | Thomas ..................... | 307/110 |
| 5,126,675 A | 6/1992 | Yang ......................... | 324/435 |
| 5,140,269 A | 8/1992 | Champlin .................. | 324/433 |
| 5,144,218 A | 9/1992 | Bosscha ..................... | 320/44 |
| 5,144,248 A | 9/1992 | Alexandres et al. ........ | 324/428 |
| 5,160,881 A | 11/1992 | Schramm et al. ............. | 322/7 |
| 5,170,124 A | 12/1992 | Blair et al. ................. | 324/434 |
| 5,179,335 A | 1/1993 | Nor ........................... | 320/21 |
| 5,194,799 A | 3/1993 | Tomantschger ............... | 320/2 |
| 5,204,611 A | 4/1993 | Nor et al. ..................... | 320/21 |
| 5,214,370 A | 5/1993 | Harm et al. ................. | 320/35 |
| 5,214,385 A | 5/1993 | Gabriel et al. .............. | 324/434 |
| 5,241,275 A | 8/1993 | Fang ......................... | 324/430 |
| 5,254,952 A | 10/1993 | Salley et al. ................ | 324/429 |
| 5,266,880 A | 11/1993 | Newland ..................... | 320/14 |
| 5,281,919 A | 1/1994 | Palanisamy ................ | 324/427 |
| 5,281,920 A | 1/1994 | Wurst ......................... | 324/430 |
| 5,295,078 A | 3/1994 | Stich et al. ................. | 364/483 |
| 5,298,797 A | 3/1994 | Redl .......................... | 307/246 |
| 5,300,874 A | 4/1994 | Shimamoto et al. .......... | 320/15 |
| 5,302,902 A | 4/1994 | Groehl ....................... | 324/434 |
| 5,315,287 A | 5/1994 | Sol ............................ | 340/455 |
| 5,321,626 A | 6/1994 | Palladino .................... | 364/483 |
| 5,331,268 A | 7/1994 | Patino et al. ................ | 320/20 |
| 5,336,993 A | 8/1994 | Thomas et al. .......... | 324/158.1 |
| 5,338,515 A | 8/1994 | Dalla Betta et al. .......... | 422/95 |
| 5,339,018 A * | 8/1994 | Brokaw ...................... | 320/147 |
| 5,343,380 A | 8/1994 | Champlin .................. | 363/46 |
| 5,347,163 A | 9/1994 | Yoshimura .................. | 307/66 |
| 5,352,968 A | 10/1994 | Reni et al. .................. | 320/35 |
| 5,365,160 A | 11/1994 | Leppo et al. ................. | 320/22 |
| 5,365,453 A | 11/1994 | Startup et al. .............. | 364/481 |
| 5,381,096 A | 1/1995 | Hirzel ........................ | 324/427 |
| 5,412,323 A * | 5/1995 | Kato et al. .................. | 324/429 |
| 5,426,371 A * | 6/1995 | Salley et al. ................ | 324/429 |
| 5,426,416 A * | 6/1995 | Jefferies et al. ............. | 340/664 |
| 5,432,426 A | 7/1995 | Yoshida ..................... | 320/20 |
| 5,434,495 A | 7/1995 | Toko ......................... | 320/44 |
| 5,435,185 A | 7/1995 | Eagan ........................ | 73/587 |
| 5,442,274 A | 8/1995 | Tamai ........................ | 320/23 |
| 5,445,026 A | 8/1995 | Eagan ........................ | 73/591 |
| 5,449,996 A | 9/1995 | Matsumoto et al. .......... | 320/20 |
| 5,449,997 A | 9/1995 | Gilmore et al. ............. | 320/39 |
| 5,451,881 A | 9/1995 | Finger ....................... | 324/433 |
| 5,457,377 A | 10/1995 | Jonsson ...................... | 320/5 |
| 5,469,043 A | 11/1995 | Cherng et al. ............... | 320/31 |
| 5,485,090 A | 1/1996 | Stephens ..................... | 324/433 |
| 5,488,300 A | 1/1996 | Jamieson .................... | 324/432 |
| 5,519,383 A | 5/1996 | De La Rosa ................ | 340/636 |
| 5,528,148 A * | 6/1996 | Rogers ....................... | 320/137 |
| 5,537,967 A | 7/1996 | Tashiro et al. ............ | 123/792.1 |
| 5,546,317 A | 8/1996 | Andrieu ...................... | 364/481 |
| 5,548,273 A | 8/1996 | Nicol et al. ................. | 340/439 |
| 5,550,485 A | 8/1996 | Falk .......................... | 324/772 |
| 5,561,380 A | 10/1996 | Sway-Tin et al. ........... | 324/509 |
| 5,562,501 A | 10/1996 | Kinoshita et al. ........... | 439/852 |
| 5,572,136 A | 11/1996 | Champlin .................... | 324/426 |
| 5,574,355 A | 11/1996 | McShane et al. ........ | 320/39 |
| 5,583,416 A | 12/1996 | Klang ........................ | 320/22 |
| 5,585,728 A | 12/1996 | Champlin .................. | 324/427 |
| 5,589,757 A | 12/1996 | Klang ........................ | 320/22 |
| 5,592,093 A | 1/1997 | Klingbiel .................... | 324/426 |
| 5,596,260 A | 1/1997 | Moravec et al. ............. | 320/30 |
| 5,598,098 A | 1/1997 | Champlin .................. | 324/430 |
| 5,602,462 A | 2/1997 | Stich et al. ................. | 323/258 |
| 5,606,242 A | 2/1997 | Hull et al. .................... | 320/48 |
| 5,621,298 A | 4/1997 | Harvey ....................... | 320/5 |
| 4,024,953 A | 5/1997 | Nailor, III .................... | 206/344 |
| 5,633,985 A | 5/1997 | Severson et al. .......... | 395/2.76 |
| 5,637,978 A | 6/1997 | Kellett et al. .................. | 320/2 |
| 5,642,031 A | 6/1997 | Brotto ........................ | 320/21 |
| 5,650,937 A | 7/1997 | Bounaga ..................... | 364/483 |
| 5,652,501 A | 7/1997 | McClure et al. .............. | 320/17 |
| 5,653,659 A | 8/1997 | Kunibe et al. .............. | 477/111 |
| 5,656,920 A | 8/1997 | Cherng et al. ................ | 320/31 |
| 4,047,091 A | 9/1997 | Hutchines et al. ............ | 363/59 |
| 5,675,234 A | 10/1997 | Greene ........................ | 320/15 |
| 5,677,077 A | 10/1997 | Faulk .......................... | 429/90 |
| 5,699,050 A | 12/1997 | Kanazawa .................. | 340/636 |
| 5,701,089 A | 12/1997 | Perkins ...................... | 327/772 |
| 5,705,929 A | 1/1998 | Caravello et al. ........... | 324/430 |
| 5,710,503 A | 1/1998 | Sideris et al. ................. | 320/6 |
| 5,711,648 A | 1/1998 | Hammerslag ............... | 414/786 |
| 5,717,336 A | 2/1998 | Basell et al. ................. | 324/430 |
| 5,717,937 A | 2/1998 | Fritz ....................... | 395/750.01 |
| 5,739,677 A | 4/1998 | Matsuda et al. .............. | 320/5 |
| 5,747,909 A | 5/1998 | Syverson et al. ............. | 310/156 |
| 5,754,417 A | 5/1998 | Nicollini .................... | 363/60 |
| 5,757,192 A | 5/1998 | McShane et al. ........... | 324/427 |
| 5,760,587 A | 6/1998 | Harvey ....................... | 324/434 |
| 5,773,978 A | 6/1998 | Becker ....................... | 324/430 |
| 5,789,899 A | 8/1998 | van Phuoc et al. ........... | 320/30 |
| 5,793,359 A | 8/1998 | Ushikubo .................... | 345/169 |
| 5,808,469 A | 9/1998 | Kopera ..................... | 324/43.4 |
| 5,818,234 A | 10/1998 | McKinnon .................. | 324/433 |
| 5,821,756 A | 10/1998 | McShane et al. ........... | 324/430 |
| 5,825,174 A * | 10/1998 | Parker ........................ | 324/106 |
| 5,831,435 A | 11/1998 | Troy .......................... | 324/426 |
| 5,862,515 A | 1/1999 | Kobayashi et al. ........... | 702/63 |
| 5,872,443 A | 2/1999 | Williamson ................. | 320/21 |
| 5,895,440 A | 4/1999 | Proctor et al. ................ | 702/63 |
| 5,914,605 A | 6/1999 | Bertness ..................... | 324/430 |
| 5,927,938 A | 7/1999 | Hammerslag ............... | 414/809 |
| 5,929,609 A | 7/1999 | Joy et al. ...................... | 322/25 |
| 5,939,855 A * | 8/1999 | Proctor et al. ............. | 320/104 |
| 5,939,861 A | 8/1999 | Joko et al. | |
| 5,945,829 A | 8/1999 | Bertness ..................... | 324/430 |
| 5,951,229 A | 9/1999 | Hammerslag ............... | 414/398 |
| 5,961,561 A | 10/1999 | Wakefield, II .............. | 701/29 |
| 5,961,604 A | 10/1999 | Anderson et al. ........... | 709/229 |
| 5,969,625 A | 10/1999 | Russo ........................ | 340/636 |
| 6,002,238 A | 12/1999 | Champlin .................. | 320/134 |
| 6,008,652 A | 12/1999 | Theofanopoulos et al. . | 324/434 |
| 6,009,369 A | 12/1999 | Biosvert et al. .............. | 701/99 |
| 6,031,354 A | 2/2000 | Wiley et al. ................. | 320/116 |
| 6,037,751 A | 3/2000 | Klang ........................ | 320/160 |
| 6,037,777 A | 3/2000 | Champlin .................. | 324/430 |
| 6,051,976 A | 4/2000 | Bertness ..................... | 324/426 |
| 6,072,299 A | 6/2000 | Kurie et al. ................. | 320/112 |
| 6,072,300 A | 6/2000 | Tsuji ......................... | 320/116 |
| 6,081,098 A | 6/2000 | Bertness et al. ............. | 320/134 |

| | | | | | | |
|---|---|---|---|---|---|---|
| 6,091,245 | A | 7/2000 | Bertness ..................... 324/426 | JP | 5216550 | 8/1993 |
| 6,094,033 | A | 7/2000 | Ding et al. ................. 320/132 | JP | 7-128414 | 5/1995 |
| 6,104,167 | A | 8/2000 | Bertness et al. ............ 320/132 | WO | WO 93/22666 | 11/1993 |
| 6,114,834 | A | 9/2000 | Parise ........................ 320/109 | WO | WO 94/05069 | 3/1994 |
| 6,137,269 | A | 10/2000 | Champlin ................... 320/150 | WO | WO 98/58270 | 12/1998 |
| 6,140,797 | A | 10/2000 | Dunn .......................... 320/105 | WO | WO 99/23738 | 5/1999 |
| 6,144,185 | A | 11/2000 | Dougherty et al. ......... 320/132 | | | |
| 6,150,793 | A | 11/2000 | Lesesky et al. ............. 320/104 | | | |
| 6,161,640 | A | 12/2000 | Yamaguchi ................ 180/65.8 | | | |
| 6,163,156 | A | 12/2000 | Bertness ..................... 324/426 | | | |
| 6,172,483 | B1 | 1/2001 | Champlin ................... 320/134 | | | |
| 6,172,505 | B1 | 1/2001 | Bertness ..................... 324/430 | | | |
| 6,181,545 | B1 | 1/2001 | Amatucci et al. ........... 367/502 | | | |
| 6,222,369 | B1 | 4/2001 | Champlin ................... 324/430 | | | |
| 6,225,808 | B1 | 5/2001 | Varghese et al. ............ 324/426 | | | |
| 6,236,332 | B1 | 5/2001 | Conkright et al. ..... 340/825.06 | | | |
| 6,249,124 | B1 | 6/2001 | Bertness ..................... 324/426 | | | |
| 6,250,973 | B1 | 6/2001 | Lowery et al. ............. 439/763 | | | |
| 6,254,438 | B1 | 7/2001 | Gaunt ......................... 439/755 | | | |
| 6,259,254 | B1 | 7/2001 | Klang ......................... 324/427 | | | |
| 6,262,563 | B1 | 7/2001 | Champlin ................... 320/134 | | | |
| 6,294,896 | B1 | 9/2001 | Champlin ................... 320/134 | | | |
| 6,294,897 | B1 | 9/2001 | Champlin ................... 320/153 | | | |
| 6,304,087 | B1 | 10/2001 | Bertness ..................... 324/426 | | | |
| 6,310,481 | B2 | 10/2001 | Bertess ....................... 324/430 | | | |
| 6,313,607 | B1 | 11/2001 | Champlin ................... 320/132 | | | |
| 6,313,608 | B1 | 11/2001 | Varghese et al. .............. 32/132 | | | |
| 6,316,914 | B1 | 11/2001 | Bertness ..................... 320/134 | | | |
| 6,323,650 | B1 | 11/2001 | Bertness et al. ............ 324/426 | | | |
| 6,329,793 | B1 | 12/2001 | Bertness et al. ............ 320/132 | | | |
| 6,331,762 | B1 | 12/2001 | Bertness ..................... 320/134 | | | |
| 6,332,113 | B1 | 12/2001 | Bertness ........................ 702/63 | | | |
| 6,346,795 | B2 | 2/2002 | Haraguchi et al. .......... 320/136 | | | |
| 6,347,958 | B1 | 2/2002 | Tsai ............................ 439/488 | | | |
| 6,351,102 | B1 | 2/2002 | Troy ........................... 320/139 | | | |
| 6,359,441 | B1 | 3/2002 | Bertness ..................... 324/426 | | | |
| 6,363,303 | B1 | 3/2002 | Bertness ........................ 701/29 | | | |

FOREIGN PATENT DOCUMENTS

| | | | |
|---|---|---|---|
| EP | 0 772 056 A1 | 5/1997 | |
| FR | 2 749 397 | 12/1997 | |
| GB | 2 088 159 A | 6/1982 | |
| JP | 59-17892 | 1/1984 | |
| JP | 59-17893 | 1/1984 | |
| JP | 59/17894 | 1/1984 | |
| JP | 59017894 | 1/1984 | |
| JP | 59215674 | 12/1984 | |
| JP | 60225078 | 11/1985 | |
| JP | 62-180284 | 8/1987 | |
| JP | 63027776 | 2/1988 | |
| JP | 03274479 | 12/1991 | |
| JP | 03282276 | 12/1991 | |
| JP | 4-8636 | 1/1992 | |
| JP | 04131779 | 5/1992 | |
| JP | 04372536 | 12/1992 | |

OTHER PUBLICATIONS

"A Look at the Impedance of a Cell", by S. Debardelaben, *IEEE*, 1988, pp. 394–397.

"The Impedence of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. MacDonald et al., *J. Electroanal, Chem.*, 1991, pp. 1–11.

"Internal Resistance: Harbinger of Capacity Loss in Starved Electrolyte Sealed Lead Acid Batteries", by Vaccaro, F.J. et al., AT&T Bell Laboratories, 1987 IEEE, Ch. 2477, pp. 128, 131.

IEEE Recommended Practice For Maintenance, Testings, and Replacement of Large Lead Storage Batteries for Generating Stations and Substations, The Institute of Electrical and Electronics Engineers, Inc.,*ANSI/IEEE Std.* 450–1987, Mar. 3, 1987 pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.,* Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", Linear Brief 5, Mar. 1969.

Burr–Brown Corporation, "Design A 60 Hz Notch Filter with the UAF42", Jan., 1994, AB–071, 1994.

National Semiconductor Corporation, "LMF90–$4^{th}$–Order Elliptic Notch Filter", RRD–B30M115, Dec. 1994.

\* cited by examiner

ALTERNATOR TESTER

FIELD OF THE INVENTION

This invention relates generally to the field of vehicle charging systems, and, more particularly, to an apparatus and a method for carrying out diagnostic tests on automobile alternators.

BACKGROUND OF THE INVENTION

The use of automobile battery testers as a means of segregating "good" batteries (i.e., those capable of delivering and accepting adequate charge) from "bad" batteries (i.e., those incapable of delivering and accepting adequate charge) has become prevalent in recent years. Typically, when encountering problems with starting their automobiles, drivers suspect the battery to be the cause of the problems and immediately seek a replacement. If the battery was purchased with an accompanying warranty, the driver returns it to the battery retailer requesting an exchange of the suspect battery for a new one, on a free or prorated basis. Without proper testing, these suspect batteries are then returned to the battery manufacturer or scrap smelters where it is determined that a significant proportion are still good. This situation has resulted in substantial warranty costs to the battery retailer or the battery manufacturer and a major inconvenience to the customer.

For this reason, many manufacturers have developed automobile battery diagnostic testers for use by battery retailers and automotive service centers. These devices are intended to distinguish between good and bad batteries. Good batteries are returned to the customer for further use, often after recharging. New batteries are furnished to warranty customers only when it is determined that the returned battery is, in fact, bad and incapable of delivering or accepting adequate charge.

The use of automobile battery diagnostic testers and chargers has shown that many automotive batteries are still good but in a discharged condition. In many situations, this discharge is caused by various vehicle accessories inadvertently being left on, thus causing the depletion of battery charge and a no-start condition. In that case, the battery is adequately recharged and returned to the customer for immediate use without further starting problems.

In a properly functioning automobile, the vehicle charging system functions so that the battery is normally recharged during operation of the vehicle. To accomplish the recharge, an alternator or electric generator is used to convert a portion of the engine's rotational mechanical energy into alternating current that is then rectified before reaching the automobile's electrical system. The alternator, which is driven by a belt attached to an engine pulley, generates the power necessary to sustain the vehicle electrical system accessories and to replace the charge depleted from the battery during normal usage of the automobile. Failure of the vehicle charging system forces the battery to sustain the vehicle loads thus depleting its charge. Failure to recharge adequately will lead to low power, sulfation and eventual failure of the battery and, significantly, to its subsequent replacement. This can lead to expensive and bothersome multiple battery replacements before the actual cause of failure is determined. Thus, it is important that the vehicle charging system be tested when a battery is found to have charge problems.

There are a number of methods that have been developed for use in determining the effectiveness of a vehicle's charging system. The definitive test requires removing the alternator from the vehicle, mounting the alternator on a test stand and monitoring the output of the alternator over a full range of rotation speeds and loads. This method, however, is not practical or convenient for most uses.

Another method is to test the alternator in the vehicle by measuring its voltage and current under load. Current is normally measured with a special current sensor (Hall effect) that is attached or affixed in the correct direction to the proper wires leading from the alternator. Increasing loads are imposed on the system until a maximum alternator output current is reached. Voltage is normally measured with sensors at the battery terminals, although it will be significantly affected by high charge rates.

Another method used is to measure only the battery voltage while the alternator is operating. While simple to operate, voltage sensors alone do not provide the definitive data needed to adequately determine if the vehicle charging system is fully functional, especially if the battery is discharged.

Also, a simple but dangerous method is often used. This involves disconnecting a connector cable from the battery once the engine is running and noting whether the engine quits. If it does, there is inadequate output from the alternator to handle the vehicle electrical system. Removal of a connector from the battery while in operation can cause a spark resulting in a possible explosion. Also, if the voltage regulator is faulty, high voltage can be impressed on the electrical system causing failure of its sensitive components.

Test methods of the sort described herein can produce varied results, are often cumbersome to set up and operate, are difficult to interpret and can even be dangerous. Operators must usually have special training in placement of the sensors and operation of the system.

Accordingly, despite the clear need for a highly discriminating alternator diagnostic test unit, it is believed that none of the types of test methods being used satisfy the need described herein. The situation is, of course, exacerbated by the increasing role battery retailers play in testing batteries that are serviced under warranty. The personnel responsible for dealing with battery returns have neither discriminating test units nor proper training to determine whether the battery being returned is bad or discharged simply as a result of a faulty vehicle charging system.

Furthermore, to satisfy the waiting customer a decision as to whether the battery is good or bad, and whether the vehicle charging system is operating properly, needs to be capable of being provided in a relatively short period of time.

Given the many and varied parameters that need to be addressed to allow a highly discriminating diagnostic testing regimen to take place, providing a suitable diagnostic test unit which can be used by personnel with limited training is a formidable task. Accordingly, it is a primary object of the present invention to provide a method and apparatus capable of rapidly determining whether the vehicle charging system is operating properly. A more specific object of this invention provides a test regimen capable of carrying out the appropriate determination in no more than two minutes, and still more preferably less than one minute.

Another object lies in the provision of a diagnostic test unit capable of testing various types of vehicle electrical systems having a variety of different load components while appropriately determining whether the vehicle charging system is operating properly.

Still another object of the present invention provides a diagnostic test that can be performed on the vehicle charging system without special test leads and sensor positioning.

Yet another object of the present invention provides a diagnostic test unit that can be operated safely by personnel with limited training at most.

Other objects and advantages will become apparent from the following detailed description.

SUMMARY OF THE INVENTION

In general, the present invention provides a straightforward diagnostic system and testing procedure that gives relevant data on the performance of the charging system in a battery-based electrical system.

The procedure begins by first testing the battery to determine if it has enough power to start the vehicle. If it is determined that the battery has acceptable starting capabilities, the battery is then tested to determine if it is charged sufficiently to produce an acceptable alternator test. If the battery has acceptable starting and charging characteristics, the alternator test is executed to determine the alternator charging voltage (at minimal charging current) and the alternator charging current (at minimal system voltage).

As a first step, a threshold charging voltage for the system is determined. The threshold charging voltage represents the point at which the voltage supplied by the alternator is sufficient to support a nominal vehicle electrical system load without charging the battery. Once the threshold voltage is measured, the alternator is powered by starting the vehicle and the battery is recharged briefly to replace any resultant capacity losses that occurred as a result of starting.

To determine the alternator charging current, the battery-based electronic system is loaded with increasing amounts of current from an external load until the electrical system voltage drops below the previously measured threshold voltage. At this point, the charging current generated by the alternator is determined by measuring the external load current. To determine the alternator charging voltage, the charging current is eliminated by applying an external charge current. The external charge current is adjusted until the alternator charging current is diminished and stable. The voltage of the battery-based electrical system, at this point, represents the alternator charging voltage at diminished current The alternator charging current and alternator charging voltage are then compared with the expected values and the alternator is rated as good or bad.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE PREFERRED EMBODIMENTS

The present invention is directed to a diagnostic system and method that tests an electrical system consisting of a charger and a battery. While this invention is primarily described with respect to the diagnostic testing of automotive systems, there is no intention to limit the invention. Rather, the invention is specifically intended to be used with all types of battery-based electrical systems wherein an alternator or generator provides the electrical power for system operation and recharging the battery. Such systems include, but are not limited to, all types of automobiles, trucks, motorcycles, powerboats, snowmobiles and other such vehicles.

Figure 1:
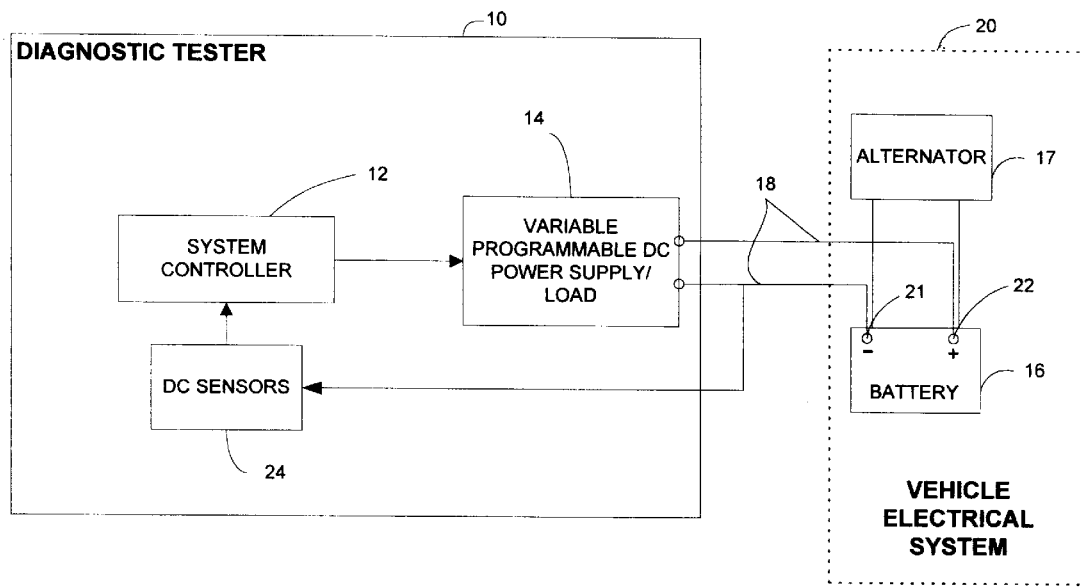
FIG. 1 is a block diagram of an alternator diagnostic tester embodying the present invention.

Turning to the drawings and referring first to FIG. 1, a diagnostic tester 10 according to the invention comprises a system controller 12, a variable programmable DC power supply and load 14, DC sensors 24, and conducting cables 18. The system controller 12 is coupled to the power supply and load 14 and includes control circuitry for regulating the output of the power supply and load 14. The diagnostic tester 10 is coupled to a vehicle electrical system 20. The vehicle electrical system 20 is comprised of an alternator 17 coupled in a conventional manner to a battery 16. The power supply and load 14 of the diagnostic tester 10 is coupled in a conventional manner to the vehicle electrical system 20 using conducting cables 18 which link the power supply and load 14 to the charging terminals 21, 22 of the battery 16 or to other convenient connection points in the electrical system. Depending on the amount of charge to be conveyed, the conducting cables 18 may comprise heavy-gauge copper wires or cabling compliant with National Electrical Code requirements. The DC sensors, which sense current to and from the variable power supply and load 14 and the voltage of the electrical system 20, return the values thereof to the system controller 12 to which they are coupled.

Figure 2:
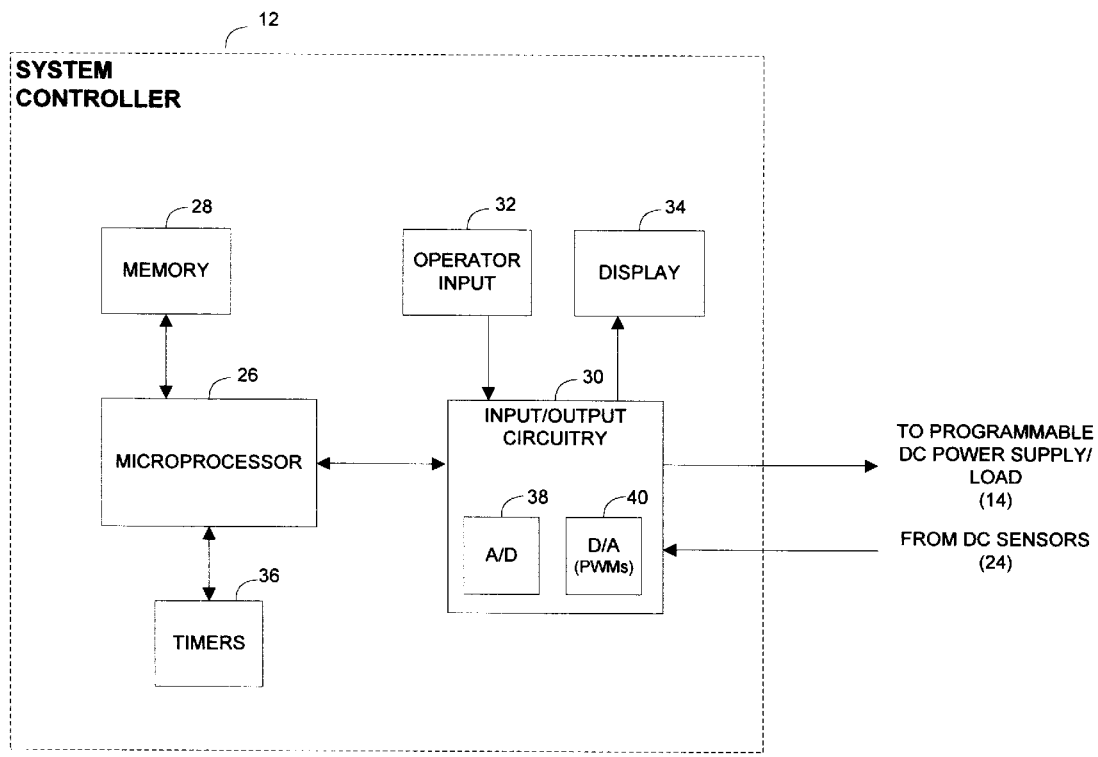
FIG. 2 is a block diagram of a system controller for performing diagnostic tests on an alternator according to the invention.

As shown in FIG. 2, the system controller 12 comprises a microprocessor 26, a memory 28, timers 36, and input/output (I/O) circuitry 30 connected in a conventional manner. The memory 28 is comprised of random access memory (RAM), read-only memory (ROM) and the like. The I/O circuitry 30 is coupled to an operator input 32 that comprises the means to input relevant operator commands and data. The I/O circuitry 30 is also coupled to a display 34 that comprises the means to display relevant output messages, such as messages informing the operator on the status of diagnostic testing, or messages prompting the operator to enter commands or data from the operator input device 32. The I/O circuitry 30 is further coupled to the power supply and load 14 and comprises the means to send commands originating in the microprocessor 26 to the power supply and load 14. Similarly, the I/O circuitry 30, which is coupled to the DC sensors 24 through the use of sensing leads, comprises the means to receive sensor data.

The preferred system controller 12 includes analog-to-digital converters 38 therein for converting the current and voltage measurements supplied by the DC sensors 24 to digital values capable of being manipulated by the microprocessor 26. The system controller 12 also includes a digital-to-analog converter 40 therein for converting a digital control signal to a suitable analog signal required by the power supply and load 14. In the preferred embodiment, pulse width modulators (PWMs) are used in place of digital-to-analog converters 40 to generate the appropriate command signal. Moreover, in the preferred embodiment, the analog-to-digital converters 38 and pulse width modulators 40 are contained within, or on board, the microprocessor 26 along with RAM and ROM-28 and timers 36. Alternatively, the analog-to-digital converters and pulse width modulators can be separate devices contained within either the input/output circuitry 30 (as shown) or the DC sensors 24.

One integrated circuit, a Microchip PIC17C756 microcontroller, has been identified as being particularly useful as a component within the system controller 12, as it provides a microprocessor, RAM, ROM, analog-to-digital converters and timer/counter capabilities in a single chip. The PIC17C756 analog-to-digital converters allow conversion of an analog input signal, here voltage, to a corresponding 10-bit digital number through the use of analog voltage comparators. The PIC17C756 also allows transmission of signals enabled through the use of on-board pulse width modulators.

Figure 3:
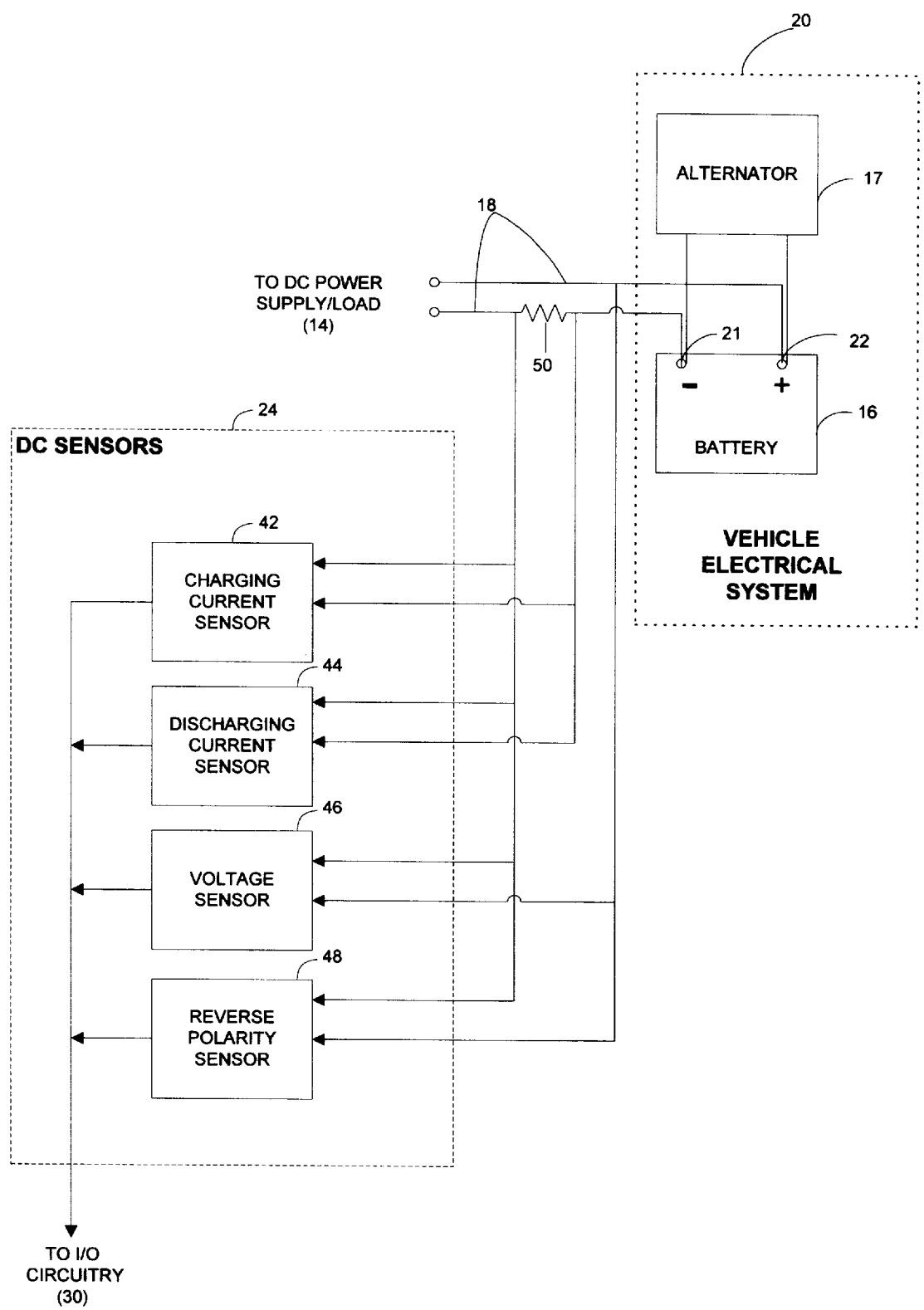
FIG. 3 is a block diagram of DC sensors for sensing voltage in the vehicle electrical system and current to and from the diagnostic tester according to the invention.

As represented in FIG. 3, the exemplary diagnostic tester is comprised of four DC sensors: a charging current sensor 42, a discharging current sensor 44, a voltage sensor 46, and a reverse polarity sensor 48. As illustrated, the voltage sensor 46 is connected in a conventional manner to measure the voltage across the terminals 21, 22 of the battery.16. The voltage across the battery terminals 21, 22 is read and attenuated by a voltage attenuator in order to match the input range of the analog-to-digital converters 38 residing in the system controller 12. The voltage sensor 46 is selected so as to be sensitive enough to reflect critical voltage changes with 0.01V accuracy. If necessary, the voltage can be also compensated for IR voltages generated by currents flowing through the cables 18.

The reverse polarity sensor 48, connected in a like manner across the battery terminals 21, 22, senses negative voltage indicating that the cable connector leads are connected backwards. The reverse polarity sensor 48 is similarly connected to a voltage attenuator that scales the voltage reading to match the input range of the analog-to-digital converters 38.

The charging current sensor 42 and discharging current sensor 44 are connected to measure the current across a shunt resistor 50. Due to differences in current magnitude and sensitivity, two current sensors may be required to measure the charge and discharge currents. The charging current sensor 42, which is used to measure current flow into the vehicle electrical system 20 from the variable power supply in 14, is selected so as to be sensitive and accurate enough to measure changes in the current at the various steps of the alternator test procedure. (See FIG. 5). According to the invention, the charging current sensor 42 should be capable of sensing current in the range between 0 and 80 A.

The discharging sensor 44, which is used to measure current flow from the electrical system 20 to the variable load in 14, is selected so as to be sensitive enough to measure a wide range of current. According to the invention, the discharge current sensor 44 measures current flow between 0 and 400 A. In addition, the charging and discharging current sensors are connected to an amplifier that scales the current reading to match the input range of the analog-to-digital converters.

Figure 4:
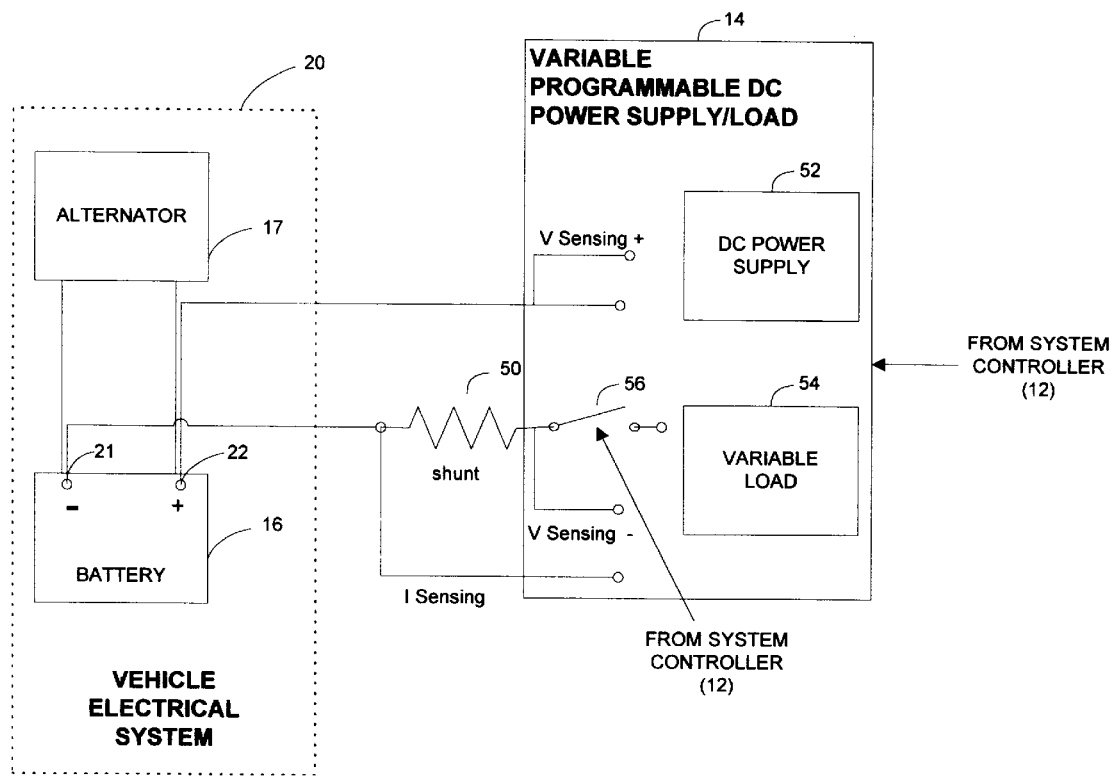
FIG. 4 is a block diagram of a variable programmable DC power supply/load for charging and discharging the vehicle electrical system according to the invention.

As shown in FIG. 4, the variable programmable DC power supply and load 14 includes a DC power supply 52 and a variable load 54. According to the invention, the power supply 52 is capable of providing an electrical charge output at either a variable voltage level or a variable current level (or both). The setting level for current and/or voltage supplied by the power supply 52 is determined by the system controller 12 which sends commands to the power supply 52. The power supply 52, therefore, includes the means to interpret the commands that can be either in the form of digital signals or analog signals. In the preferred embodiment, pulse width modulators 50 are provided within the system controller 12 so that the proper signal is provided to the programmable power supply 52.

To discharge current from the electrical system 20, a variable load 54 is programmed to provide a variable or constant (sustained) load between 0 to 400 A. Programmable load variance is used to determine battery performance during battery diagnostic testing and to match the output of the alternator during alternator testing. The preferred variable load 54 is comprised of a series of field effect transistors (FETs) connected to heat sinks. Alternatively, a series of straight resistors can be used to vary the load or one large resistor can be used while simultaneously charging and discharging to effectively vary the resistance or any combinations thereof. Like the power supply 52, the variable load 54 includes the means to interpret commands sent by the system controller 12.

During the diagnostic test, the system controller 12 may control means 56 such as a relay, a switch or the like to automatically connect the electrical system 20 to the diagnostic testing circuit 10. For example, the switch 56 is open while measuring the open circuit voltage of the system. Conversely, the switch 56 is closed allowing current to flow across a shunt resistor 50 to enable charging and discharging current measurements to be taken.

It can be readily appreciated that any number of equivalent system controllers and DC power supplies/loads can be developed from other digital and analog circuitry components to perform the desired control functions as described in more detail below. For example, a diagnostic tester apparatus can be implemented comprising a personal computer as the system controller 12 executing instructions written in a high level programming language, to control a switch mode power supply and load 14 via a data acquisition/control board interface bus. A diagnostic tester apparatus can also be implemented comprising a system with an on-board microprocessor for measuring and adjusting the components for charging and discharging but taking commands from a higher level processor on-board a PC computer via an RS232 interface bus.

While not necessary to the invention, it can also be readily appreciated that it is preferable to employ dedicated circuitry as the system controller 12 and power supply and load 14 for use in commercial applications.

Figure 5:
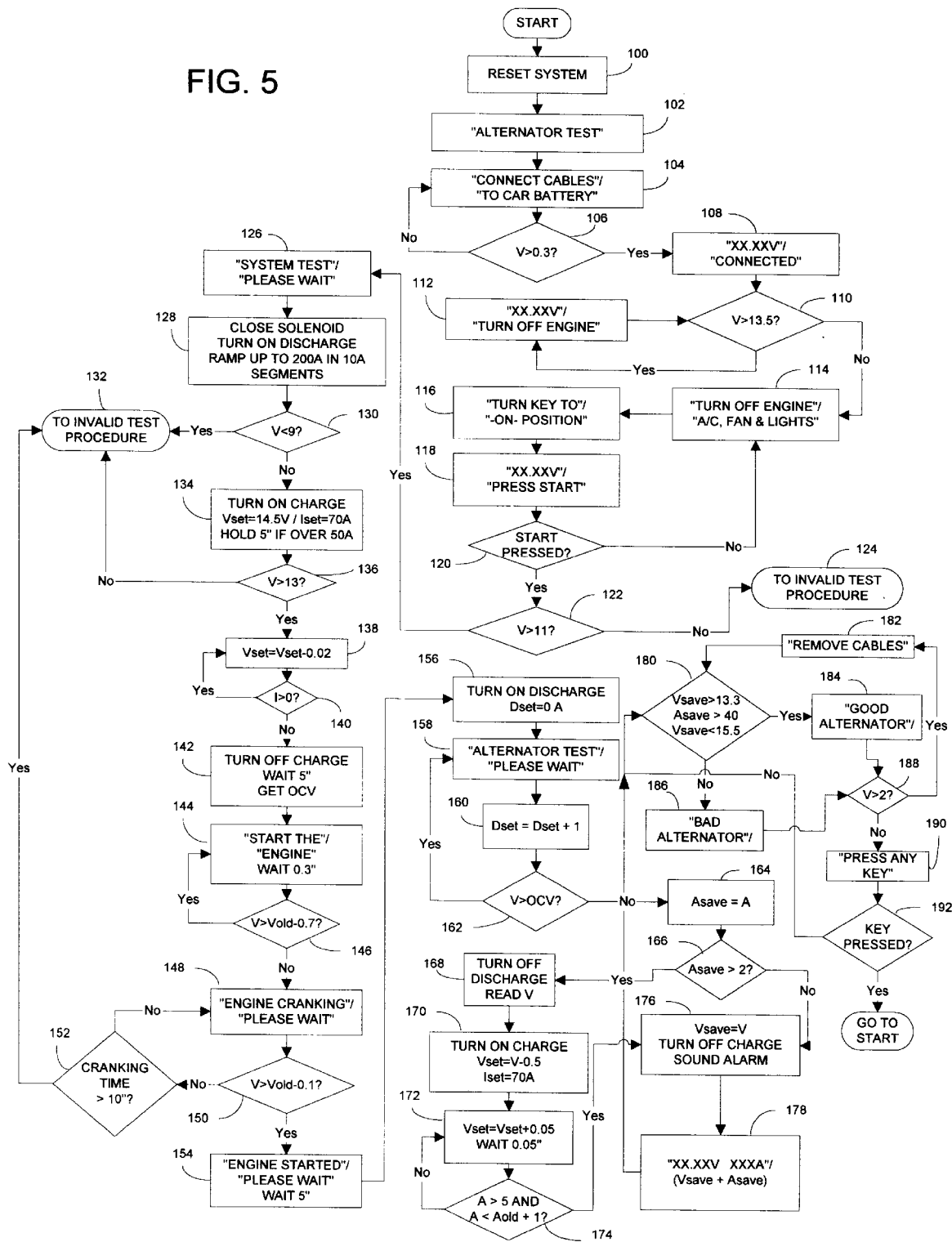
FIG. 5 is a logic flow diagram illustrating the steps involved in performing the diagnostic alternator test procedure according to the present invention.
Figure 6:
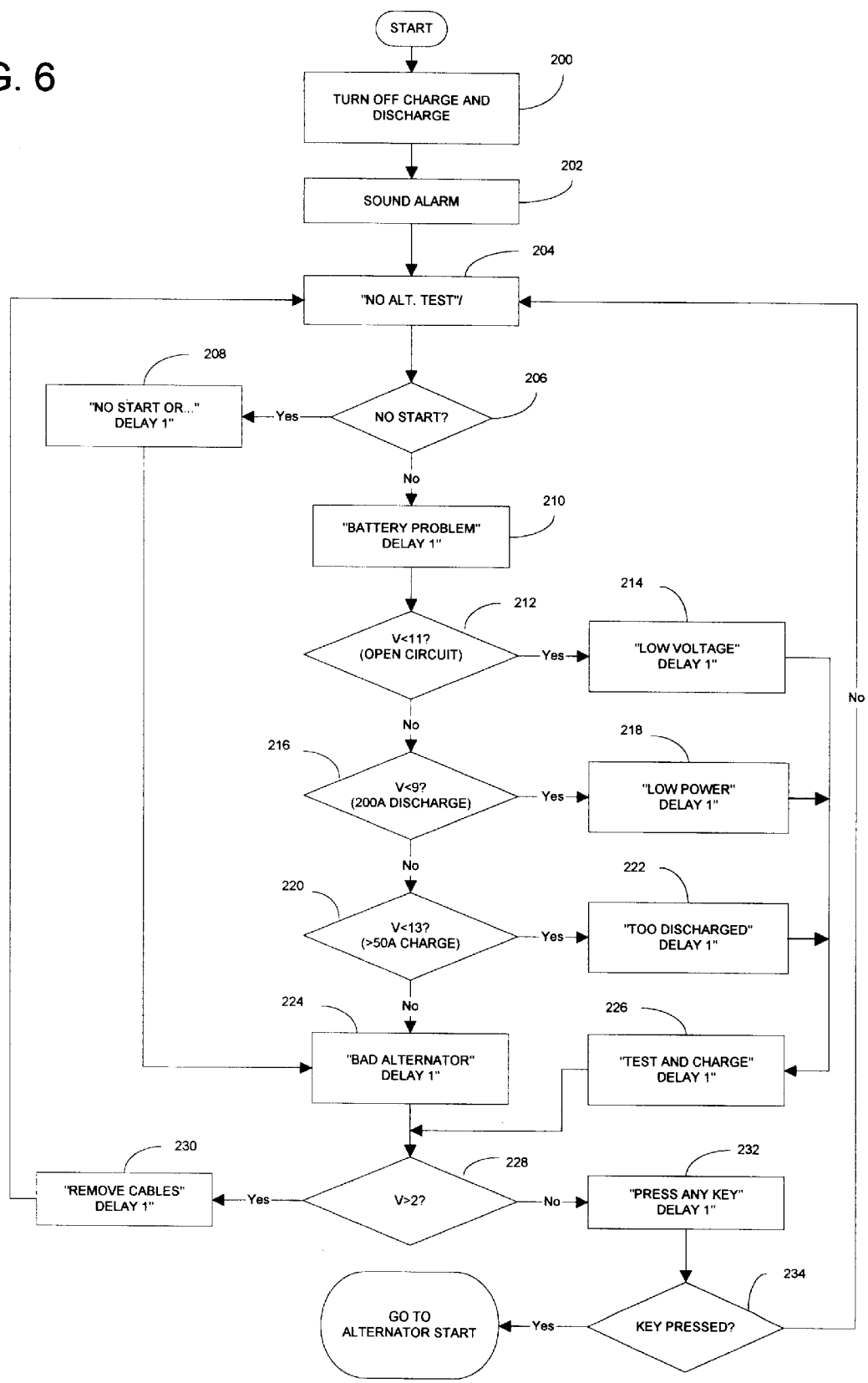
FIG. 6 is a logic flow diagram illustrating the steps involved in aborting the test procedure if the alternator test cannot be properly conducted.

According to the invention, the system controller 12 executes a software routine that performs diagnostic tests on the vehicle electrical system and more particularly to determine whether the alternator is "good" (i.e., capable of delivering acceptable power to the battery and electrical system). FIGS. 5 and 6 illustrate the steps involved in performing the diagnostic alternator test according to the present invention.

In accordance with the present invention, the alternator test apparatus and method measure the amount of current and voltage that is being produced by the alternator under distinguishing conditions. FIG. 5 illustrates the overall procedure used to implement the present invention. The exemplary alternator test procedure begins in step 100 by resetting the system variables followed by displaying messages to inform the operator that the alternator test is being run in step 102 and instructing the operator to connect the cables in step 104. In step 106, the voltage across the battery terminals (or other convenient connection points in the electrical system) is measured to determine whether the battery is connected to the diagnostic unit as depicted in FIG. 1. If the voltage measured does not register above a nominal value, around 0.3V, the message instructing the operator to connect the cables remains displayed as shown in step 106. If the voltage measured does exceed a nominal amount, the measured voltage is displayed in step 108 along with a message indicating that the battery is "connected."

In step 110, another voltage comparison is made to determine whether the automobile engine is turned on. If the voltage exceeds a value greater than that expected from a typical automobile battery, around 13.5V, the operator is instructed in step 112 to turn the engine off. If the voltage is less than the maximum allowed voltage, in steps 114–118, the operator is instructed to turn off all power draining devices, to turn the key to the "on" position and then to press start on the diagnostic unit. While it is desirable to remove all accessory loads from the system during testing, this is not always possible. The operator, therefore, is instructed to turn off the main loads (e.g., A/C, fans and lights). Putting the key in the "on" position activates the system at a nominal operating load level and thus, allows loads such as computers, day lights, fuel pumps, etc. to be taken into account as an effect on the threshold voltage level (see step 142).

Once the start of the test is signaled in step 122, the alternator test begins by first determining whether the battery has enough power to start the vehicle. Thus, the battery voltage is measured in step 124. A low battery voltage indicates heavy discharge or shorting of the battery requiring that the alternator test be aborted. In step 124, the invalid test procedure routine is executed so that the battery can be tested and charged separately before an alternator test is executed again (see FIG. 6).

If the voltage is acceptable, greater than around 11V, the test continues in steps 126–128 and the battery is quickly loaded with a high current load, ramping from 0 to 200 A. In step 130, the resultant voltage output is then measured. If the resultant voltage falls below a threshold level, around 9V, this indicates that the battery may not reliably start the vehicle for further testing. Where the resultant voltage is too low, in step 132, the invalid test procedure routine is executed so that the battery can be tested and charged separately before an alternator test is executed again (see FIG. 6).

If the battery has acceptable starting capabilities, the battery is then tested to determine if it is charged enough to provide an acceptable alternator test. In step 134, the battery is put on charge at a nominal charging voltage, around 14.5V, with a large current limit of around 70 A. If the charging current is high, over 50 A, and the charging voltage is low, under 13V, indicating a highly discharged battery, the alternator test is likewise aborted, and, in step 132, the invalid test procedure routine is executed so that the battery can be tested and charged separately before an alternator test is executed (see FIG. 6).

If the battery has acceptable starting and charging characteristics,. in step 138 the charging voltage is reduced over a short period of time until the charging current vanishes as indicated in step 140. Once the current is reduced to a low value, less than 0.5 A, the charging is ceased and the battery voltage is measured after a short duration in step 142. Interrupting the charge at that time and measuring the voltage yields the battery's open circuit voltage ("OCV"), also referred to as the threshold voltage, at its present state adjusted for charging and discharging polarizations in the system. The OCV is significant in that at any voltage greater than the OCV the alternator will. charge the battery and support the background electrical system loads, while at any voltage less than the OCV, the battery must help supply load support.

In step 144, the operator is instructed to start the vehicle. A start is detected by constantly measuring the battery voltage in step 146. When the battery voltage rapidly falls by more than a nominal value, around 0.7V, starter cranking is signaled. When a start occurs, the cranking voltage normally rises to a level at or above its original level as indicated in step 150. If the cranking voltage does not rise as anticipated, this indicates that either the car did not start or the alternator is not functioning properly, a result easily distinguishable by. the operator. In step 152, after a short amount of time (e.g., 10 seconds), an appropriate message is displayed and then in step 132, the invalid test procedure routine is executed (see FIG. 6).

Once a start occurs, in step 154 the battery is allowed to charge for a short time (e.g., 5 seconds) to recharge battery capacity removed during the start. Next, in steps 156–160, the electrical system is loaded (i.e., discharged) with increasing amounts of current while measuring the voltage in step 162. At the point where the voltage drops to the OCV measured above in step 142, the load current is equal to the amount of current that is being supplied by the alternator. This current value, referred to as the alternator charging current, is simply the amount of current that is capable of being produced by the alternator under the present operating conditions. Since the alternator is a mechanical device, the alternator charging current will vary from zero to a maximum value at a given temperature depending on rotation speed. No current, however, will be generated if no current is consumed by either loading or charging. Consequently, this process attempts to measure the maximum alternator current at idle speed or higher by sinking the current into the discharge load. In step 164, the alternator charging current is saved in memory.

If the alternator charging current is significant, i.e., greater than around 2 A, as determined in step 166, the alternator test next measures the alternator charging voltage. The alternator charging voltage is simply the voltage level at which the alternator attempts to charge the battery at vanishing current. Because the cables from the alternator to the battery and the rest of the electrical system are generally fairly thin, there is an appreciable voltage loss from the alternator to the battery when charging at high current. Therefore, to measure the charging voltage of the alternator, high charging current must be eliminated.

To accomplish this, in step 168, the unit discharge load is turned off, and, in step 170, the charger is turned on. The battery is then charged at increasing voltage in steps 172–174 until the charging current stabilizes indicating that there is no charging current coming from the alternator or the power supply current limit has been exceeded. The voltage of the battery-based electrical system, at this point, indicates the alternator charging voltage at diminished current. In step 176, the alternator charging voltage is saved in memory.

After shutting off the testing unit in step 176, a message is displayed that gives the results of the alternator test in step 178. The operator is provided with the alternator charging voltage (at minimal charging current) and the alternator charging current (at minimal system voltage).

In step 180, the alternator charging current and alternator charging voltage are analyzed. There is no universal definition of what constitutes a good or bad alternator for all vehicles and operating conditions. Rather, alternators typically vary in size from 40 A to over 125 A on some vehicles that have numerous accessories. Alternator output voltage as determined by its internal regulator also varies due to temperature compensation, manufacturer's setting and manufacturing tolerances. In very hot conditions, some manufacturers may adjust the alternators to as low as 13V while in very cold conditions, voltages are set as high as 15.5V. These adjustments are intended to restrict overcharge or increase charge acceptance, depending on the temperature and the electrical system tolerances. Consequently, the alternator tester comparison values have been set at or near minimum values to cover large and small systems in most conditions. In the preferred embodiment, a determination of good or bad is made using the following simple rules: an acceptable alternator is one that gives charging voltage greater than around 13.3V (or around 13V if significantly discharged) and less than around 15.5V, and a charging current-greater than around 40 A. The alternator test, thus, will determine if there is sufficient output to maintain a minimal system. Of course, the diagnostic values can be compared to the actual specifications of the specific vehicle alternator, if known, and treated accordingly.

If the alternator passes the diagnostic test, the operator is instructed to shut the engine off and remove the testing cables at step 182 and a message is displayed indicating the alternator is good in step 184. If the alternator fails the diagnostic test, a message is displayed indicating the alternator is bad in step 186. If a high alternator charging voltage is measured, greater than around 15.5V, this indicates that the voltage regulator within the alternator has failed and the alternator should be replaced. If the alternator output current is below the minimal level, it is suggested that the alternator test be repeated at a high rpm because the idle speed is often too low to give sufficient output in many vehicles. In step 188, the battery voltage is measured. If the connector cables are unattached, the operator is instructed in step 190 to press any key to reset the unit. Once a key press is signaled in step 192, the alternator test returns to start in step 100. If the alternator fails the alternator test again at a high rpm, this indicates that the alternator is not functioning properly and should be replaced.

FIG. 6 is a logic flow diagram that illustrates the steps involved in shutting down the charger/discharger if the alternator test cannot be conducted as determined in steps 122, 130, 136, and 150–152. As shown in steps 200 through 234 of FIG. 6, the voltage measured during the alternator test is analyzed to identify possible causes for failure of the alternator test. Once the battery is tested and charged separately, the alternator test can be executed again.

In view of the many possible embodiments to which the principles of this invention may be applied, it should be recognized that the embodiment described herein with respect to the drawing figures is meant to be illustrative only and should not be taken as limiting the scope of invention. For example, those of skill in the art will recognize that the elements of the illustrated embodiment shown in software may be implemented in hardware and vice versa or that the illustrated embodiment can be modified in arrangement and detail without departing from the spirit of the invention. Therefore, the invention as described herein contemplates all such embodiments as may come within the scope of the following claims and equivalents thereof.

I claim:

1. An apparatus for testing an alternator in a battery-based electrical system, the apparatus comprising:

a voltage sensor for adapted for attachment to the battery-based electrical system for measuring voltage of the battery-based electrical system;

a charging current sensor adapted for attachment to the battery-based electrical system for measuring current charged to the battery-based electrical system;

a discharging current sensor adapted for attachment to the battery-based electrical system for measuring current discharged from the battery-based electrical system;

a variable power supply adapted for attachment to the battery-based electrical system for varying the charging conditions of the battery-based electrical system;

a variable load adapted for attachment to the battery-based electrical system for varying the discharging conditions of the battery-based electrical system; and a system controller for use in controlling the variable power supply and load and for measuring the current and voltage generated by the alternator under the varying charging and discharging conditions of the battery-based electrical system.

2. In a battery-based electrical system comprised of a battery and an alternator, a method for testing the alternator comprising:

activating the battery-based electrical system at a nominal operating load level;

applying an external charge voltage and an external charge current to the battery-based electrical system;

adjusting the external charge voltage in steps of predetermined magnitude until the external charge current is reduced to substantially zero;

removing the external charge voltage and the external charge current from the battery-based electrical system;

measuring the threshold charging voltage of the battery-based electrical system;

powering the alternator;

applying an external discharge load to the battery-based electrical system;

adjusting the external discharge load in steps of predetermined magnitude until the charging voltage generated by the alternator is less than or equal to the threshold voltage;

determining the charging current generated by the alternator by measuring the external load current;

removing the external discharge load from the battery-based electrical system;

applying an external charge voltage and an external charge current to the battery-based electrical system;

adjusting the external charge voltage in steps of predetermined magnitude until the external charge current generally stabilizes; and determining the charging voltage generated by the alternator by measuring the battery-based electrical system voltage.

3. In a battery-based electrical system comprised of a battery and an alternator powered by an engine of a vehicle, a method for testing the alternator comprising:

determining a threshold charging voltage of the battery-based electrical system which is representative of a voltage supplied by the alternator which is sufficient to support nominal vehicle electrical system loads without charging the battery;

powering the alternator;

determining alternator charging current generated by the alternator representative of current supplied by the alternator during operation of the engine of the vehicle; and determining alternator charging voltage generated by the alternator representative of a voltage at which the alternator attempts to charge the battery at vanishing current.

4. The method as recited in claim 3 wherein the step of determining the threshold charging voltage of the battery-based electrical system comprises:

activating the battery-based electrical system at a nominal operating load level;

applying an external charge voltage and an external charge current to the battery-based electrical system;

adjusting the external charge voltage in steps of predetermined magnitude until the external charge current is reduced to substantially zero;

removing the external charge voltage and the external charge current from the battery-based electrical system; and measuring the threshold charging voltage of the battery-based electrical system.

5. The method as recited in claim 3 wherein the step of determining the charging current generated by the alternator comprises;

applying an external discharge load to the battery based electrical system;

adjusting the external discharge load in steps of predetermined magnitude until the charging voltage generated by the alternator is less than or equal to the threshold voltage; and determining the charging current generated by the alternator by measuring the external load current.

6. The method as recited in claim 3 wherein the step of determining the charging voltage generated by the alternator comprises:

applying the external charge voltage and an external charge current to the battery-based electrical system;

adjusting the external charge voltage in steps of predetermined magnitude until the external chrage current generally stabilized; and determining the charging voltage generated by the alternator by measuring the battery-based electrical system voltage.

7. The method of claim 3 including determining whether the battery has enough power to start the engine of the vehicle prior to testing the alternator.

8. The method of claim 3 including determining if the battery is sufficiently charged to provide an acceptable alternator test by charging the battery.

9. The method of claim 3 including instructing an operator to start the engine of the vehicle after determining an open circuit voltage of the battery.

10. The method of claim 9 including monitoring a battery voltage to detect starting of the engine.

11. The method of claim 3 wherein alternator charging voltage is determined only if the alternator charging current is significant.

12. The method of claim 3 including identifying the alternator as acceptable based upon the alternator charging voltage and the alternator charging current.

13. The method of claim 12 wherein identifying the alternator as acceptable is further based upon temperature.

14. The method of claim 12 wherein identifying the alternator as acceptable is further based upon alternator specifications.

15. The method of claim 3 including instructing an operator to repeat the steps of claim 3 at a greater engine RPM if the alternator current is below a minimum level.

16. An alternator tester configured to test an alternator in accordance with the method of claim 3.

17. An alternator tester for use in connection with a battery-based electrical system comprised of a vehicle battery and an alternator powered by an engine of a vehicle, the alternator tester comprised of a variable power supply and a variable load in communication with a system controller, the system controller having instructions to perform the steps of:

testing the vehicle battery to determine whether the battery is capable of delivering and accepting adequate charge; and testing the alternator to determine whether the alternator is capable of delivering acceptable power to the battery-based electrical system of the vehicle and wherein the testing includes controlling the variable power supply and the variable load.

18. The alternator tester recited in claim 17, wherein the step of testing the alternator comprises the steps of:

determining a threshold voltage of the battery-based electrical system which is representative of a voltage supplied by the alternator which is sufficient to support nominal vehicle electrical system loads without charging the battery;

powering the alternator;

determining a charging current generated by the alternator representative of current supplied by the alternator during operation of the engine of the vehicle; and determining a charging voltage generated by the alternator representative of a voltage at which the alternator attempts to charge the battery at vanishing current.

19. The alternator tester recited in claim 18, wherein the step of determining the threshold voltage of the battery-based electrical system comprises the steps of:

activating the battery-based electrical system at a nominal operating load level;

applying a charge voltage and a charge current with the variable power supply to the battery-based electrical system;

adjusting the charge voltage in steps of predetermined magnitude until the charge current is reduced to substantially zero;

removing the charge voltage from the battery-based electrical system; and measuring the threshold charging voltage of the battery-based electrical system.

20. The alternator tester recited in claim 18, wherein the step of determining the charging current generated by the alternator comprises the steps of:

applying a discharge current to the battery-based electrical system using the variable load;

adjusting the discharge current in steps of predetermined magnitude until the charging voltage generated by the alternator is less than or equal to the threshold voltage; and determining the charging current generated by the alternator by measuring the external load current.

21. The alternator tester recited in claim 18, wherein the step of determining the charging voltage of the alternator comprising the steps of:

applying the charge voltage and a charge current to the battery-based electrical system using the variable power supply;

adjusting the charge voltage in steps of predetermined magnitude until the charge current generally stabilizes; and determining the charging voltage generated by the alternator by measuring the battery-based electrical system voltage.

22. The method of claim 17 including determining whether the battery has enough power to start the engine of the vehicle prior to testing the alternator.

23. The method of claim 17 including determining if the battery is sufficiently charged to provide an acceptable alternator test by charging the battery.

24. The method of claim 17 including instructing an operator to start the engine of the vehicle after determining an open circuit voltage of the battery.

25. The method of claim 24 including monitoring a battery voltage to detect starting of the engine.

26. The method of claim 18 wherein the alternator charging voltage is determined only if the alternator charging current is significant.

27. The method of claim 20 including identifying the alternator as acceptable based upon the alternator charging voltage and the alternator charging current.

28. The method of claim 27 wherein identifying the alternator as acceptable is further based upon temperature.

29. The method of claim 27 wherein identifying the alternator is acceptable is further based upon alternator specifications.

30. The method of claim 18 including instructing an operator to repeat the steps of claim 18 at a greater engine RPM if the charging current is below a minimum level.

31. An alternator tester configured to implement the method of claim 17.

* * * * *

UNITED STATES PATENT AND TRADEMARK OFFICE
CERTIFICATE OF CORRECTION

PATENT NO. : 6,466,025 B1
DATED : October 15, 2002
INVENTOR(S) : James K. Klang

It is certified that error appears in the above-identified patent and that said Letters Patent is hereby corrected as shown below:

<u>Title page,</u>
Item [54], Add -- FOR BATTERY SYSTEM -- after "ALTERNATOR TESTER"

Item [56], References Cited, U.S. PATENT DOCUMENTS, add the following:

| | | | |
|---|---|---|---|
| -- 4,126,874 | 11/1978 | Suzuki et al | 354/60 |
| 4,207,611 | 6/1980 | Gordon | 364/580 |
| 4,217,645 | 8/1980 | Barry et al | 364/483 |
| 4,297,639 | 10/1981 | Branham | 324/429 |
| 4,315,204 | 2/1982 | Sievers et al | 322/28 |
| 4,316,185 | 2/1982 | Watrous et al | 340/636 |
| 4,322,685 | 3/1982 | Frailing et al | 324/429 |
| 4,351,405 | 6/1982 | Fields et al | 180/65 |
| 4,363,407 | 12/1982 | Barkler et al | 209/3.3 |
| 4,369,407 | 1/1983 | Korbell | 324/416 |
| 4,379,989 | 4/1983 | Kurz et al | 320/26 |
| 4,379,990 | 4/12/83 | Sievers et al | 322/99 |
| 4,390,828 | 6/1983 | Converse et al | 320/32 |
| 4,392,101 | 7/1983 | Saar et al | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al | 324/427 |
| 4,423,379 | 12/1983 | Jacobs et al | 324/429 |
| 4,424,491 | 1/1984 | Bobbett et al | 324/433 |
| 4,459,548 | 7/1984 | Lentz et al | 324/158 |
| 4,514,694 | 4/1985 | Finger | 324/429 |
| 4,520,353 | 5/1985 | McAuliffe | 340/636 |
| 4,633,418 | 12/1986 | Bishop | 364/554 |
| 4,659,977 | 4/1987 | Kissel et al | 320/64 |
| 4,663,580 | 5/1987 | Wortman | 320/35 |
| 4,667,143 | 5/1987 | Cooper et al | 320/22 |
| 4,667,279 | 5/1987 | Maier | 363/46 |
| 4,678,998 | 7/1987 | Muramatsu | 324/427 |
| 4,679,000 | 7/1987 | Clark | 324/428 |

UNITED STATES PATENT AND TRADEMARK OFFICE
CERTIFICATE OF CORRECTION

PATENT NO. : 6,466,025 B1
DATED : October 15, 2002
INVENTOR(S) : James K. Klang

It is certified that error appears in the above-identified patent and that said Letters Patent is hereby corrected as shown below:

| | | | |
|---|---|---|---|
| 4,680,528 | 7/1987 | Mikami et al | 320/32 |
| 4,697,134 | 9/1987 | Burkum et al | 320/48 |
| 4,707,795 | 11/1987 | Alber et al | 364/550 |
| 4,709,202 | 11/1987 | Koenck et al | 320/43 |
| 4,710,861 | 12/1987 | Kanner | 363/46 |
| 4,719,428 | 1/1988 | Liebermann | 324/436 |
| 4,743,855 | 5/1988 | Randin et al | 324/430 |
| 4,745,349 | 5/17/88 | Palanisamy et al | 320/22 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,847,547 | 7/1989 | Eng, Jr. et al | 320/35 -- |

Column 11,
Line 40, change "the" to -- an --.
Line 43, change "chrage" to -- charge --.
Line 44, change "stabilized" to -- stabilizes --.

Column 12,
Line 67, change "comprising" to -- comprises --.

Signed and Sealed this

Eighth Day of April, 2003

JAMES E. ROGAN
*Director of the United States Patent and Trademark Office*